(12) United States Patent
Birkeland et al.

(10) Patent No.: US 8,736,344 B1
(45) Date of Patent: May 27, 2014

(54) VOLTAGE CONTROLLED VARIABLE ATTENUATOR

(75) Inventors: Joel D. Birkeland, North Plains, OR (US); Robert G. Meyer, Berkeley, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/460,094

(22) Filed: Apr. 30, 2012

(51) Int. Cl.
*H03L 5/00* (2006.01)

(52) U.S. Cl.
USPC .......... 327/308; 327/534; 327/306; 333/81 R; 455/249.1

(58) Field of Classification Search
USPC .................. 327/306, 308, 534, 537
See application file for complete search history.

(56) References Cited

U.S. PATENT DOCUMENTS

| | | | | |
|---|---|---|---|---|
| 4,837,530 | A * | 6/1989 | Kondoh | 333/81 A |
| 5,281,928 | A * | 1/1994 | Ravid et al. | 333/81 R |
| 5,519,310 | A * | 5/1996 | Bartlett | 323/316 |
| 5,903,177 | A * | 5/1999 | Schwab et al. | 327/308 |
| 6,489,856 | B1 * | 12/2002 | Weigand | 333/81 R |
| 6,665,528 | B2 | 12/2003 | McNamara et al. | |
| 6,828,873 | B2 * | 12/2004 | Ludwig et al. | 333/81 R |
| 7,205,817 | B1 * | 4/2007 | Huang et al. | 327/308 |
| 7,477,085 | B2 * | 1/2009 | Stevenson | 327/308 |
| 7,991,293 | B2 * | 8/2011 | Chandra | 398/128 |
| 8,184,206 | B2 * | 5/2012 | Magnusen | 348/678 |
| 2008/0125068 | A1 * | 5/2008 | Magnusen | 455/200.1 |
| 2008/0159042 | A1 * | 7/2008 | Bertin et al. | 365/225.7 |
| 2008/0224801 | A1 * | 9/2008 | Ju et al. | 333/81 A |
| 2009/0128239 | A1 * | 5/2009 | Kuijk et al. | 330/254 |
| 2010/0277230 | A1 * | 11/2010 | Ngai | 327/543 |
| 2011/0115583 | A1 * | 5/2011 | Ikuma | 333/81 A |
| 2011/0260780 | A1 * | 10/2011 | Granger-Jones et al. | 327/537 |
| 2012/0139633 | A1 * | 6/2012 | Nasu et al. | 330/254 |
| 2012/0212278 | A1 * | 8/2012 | Magnusen | 327/332 |

* cited by examiner

*Primary Examiner* — Long Nguyen
*Assistant Examiner* — Patrick Chen
(74) *Attorney, Agent, or Firm* — Advent, LLP

(57) ABSTRACT

Voltage controlled variable attenuators are described that are configured to be coupled to a transmission path to furnish variable attenuation of a signal, such as a radio frequency signal. In one or more implementations, the voltage controlled variable attenuator includes at least one transistor. The transistor has an open configuration for at least substantially preventing the flow of current through the transistor, and a closed configuration for at least partially allowing the flow of current through the transistor. The variable attenuator also includes a resistive component coupled to the transistor, and configured to couple to the transmission path. The resistive component is configured to at least partially mitigate non-linear effect when the transistor transitions from the open configuration to the closed configuration. The transistor and the resistive component are configured to at least partially attenuate a signal transmitted along the transmission path when the transistor is in the closed configuration.

12 Claims, 3 Drawing Sheets

VOLTAGE CONTROLLED VARIABLE ATTENUATOR

BACKGROUND

It is often desirable to reduce the amplitude, or power, of a signal without appreciably distorting (e.g., introducing noise into) the signal's waveform characteristics. For example, radio frequency (RF) attenuators may be utilized to reduce the amplitude of an RF signal to protect a stage within an RF device from receiving a signal having an undesirably large amplitude. Varying types of attenuators may be utilized in RF devices according to the design and/or the distortion requirements of the RF device. For example, resistor RF attenuators may be utilized to provide fixed levels of signal attenuation, while PIN diode RF attenuators may be utilized when a variable attenuation level is desired.

SUMMARY

Voltage controlled variable attenuators are described that are configured to be coupled to a transmission path to furnish variable attenuation of a signal, such as a radio frequency (RF) signal. In one or more implementations, the voltage controlled variable attenuator includes at least one transistor. The transistor has an open configuration for at least substantially preventing the flow of current through the transistor, and a closed configuration for at least partially allowing the flow of current through the transistor. The variable attenuator also includes a resistive component coupled to the transistor, and configured to couple to the transmission path. The resistive component is configured to at least partially mitigate nonlinear effect when the transistor transitions from the open configuration to the closed configuration. The transistor and the resistive component are configured to at least partially attenuate a signal transmitted along the transmission path when the transistor is in the closed configuration.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
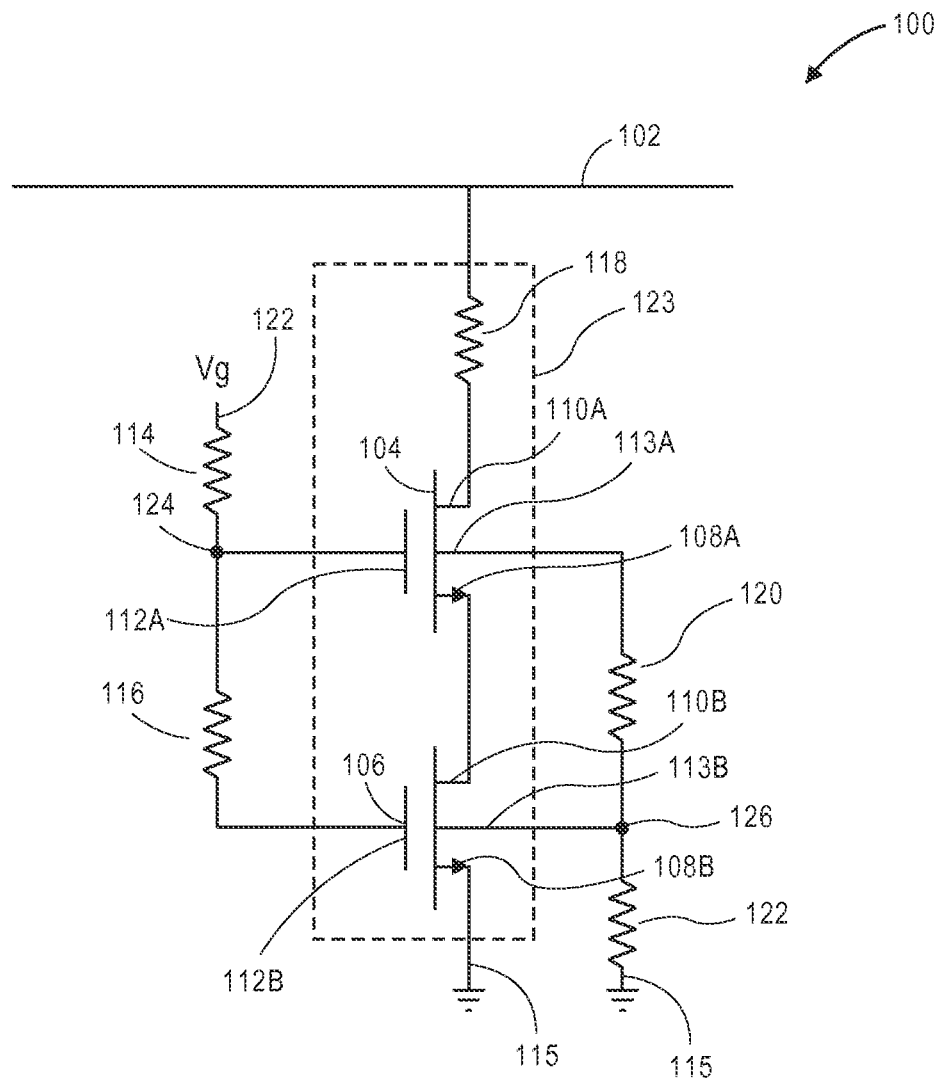
FIG. 1A is a circuit diagram illustrating a voltage controlled variable attenuator in accordance with an example implementation of the present disclosure, wherein the voltage controlled variable attenuator includes a first transistor and a second transistor coupled in series with a resistive component.

Attenuators are utilized to reduce the amplitude of a signal to protect a component within a radio frequency (RF) device from receiving a signal having an undesirably large amplitude. However, it is desirable to attenuate the signal without introducing distortion characteristics, or noise, into the signal. For example, attenuators having impedances within the signal path, such as pi attenuators, that typically introduce unwanted distortion characteristics (e.g., insertion loss) into the signal during minimum attenuation periods (e.g., periods when attenuation is not desirable). Any distortion characteristics introduced into the signal may be amplified by gain circuitry, which can be reflected in the final output of the RF device.

Accordingly, a voltage controlled variable attenuator is described that minimizes insertion loss during minimum attenuation periods. In an implementation, a system may include multiple voltage controlled variable attenuators coupled in parallel along a transmission path between a signal source that is configured to furnish a signal, such as an RF signal, and a signal load that is configured to receive the signal. The system includes no impedance components (e.g., resistors, transistors) that would introduce insertion loss to the signal within the direct path of the signal.

In one or more implementations, the voltage controlled variable attenuator includes at least one transistor. The transistor has an open configuration for at least substantially preventing the flow of current through the transistor, and a closed configuration for at least partially allowing the flow of current through the transistor. The variable attenuator also includes a resistive component coupled to the transistor, and configured to couple to the transmission path. The resistive component is configured to at least partially mitigate nonlinear effect when the transistor transitions from the open configuration to the closed configuration. In a specific implementation, the resistive component is a resistor. The transistor and the resistive component are configured to at least partially attenuate a signal transmitted along the transmission path when the transistor is in the closed configuration.

Multiple voltage controlled variable attenuators may be utilized within a system to mitigate insertion loss in some instances and attenuate the signal in other instances. For example, a system that includes multiple voltage controlled variable attenuators connected in parallel can mitigate insertion loss (e.g., the signal is transmitted from the signal source to the signal load without incurring substantial insertion loss) when the first transistor and the second transistor of each variable attenuator are in the open configuration. In another example, when the first transistor and the second transistor of at least one variable attenuator is in the closed configuration, the signal is transmitted with some insertion loss.

Example Voltage Controlled Variable Attenuators

Figure 1B:
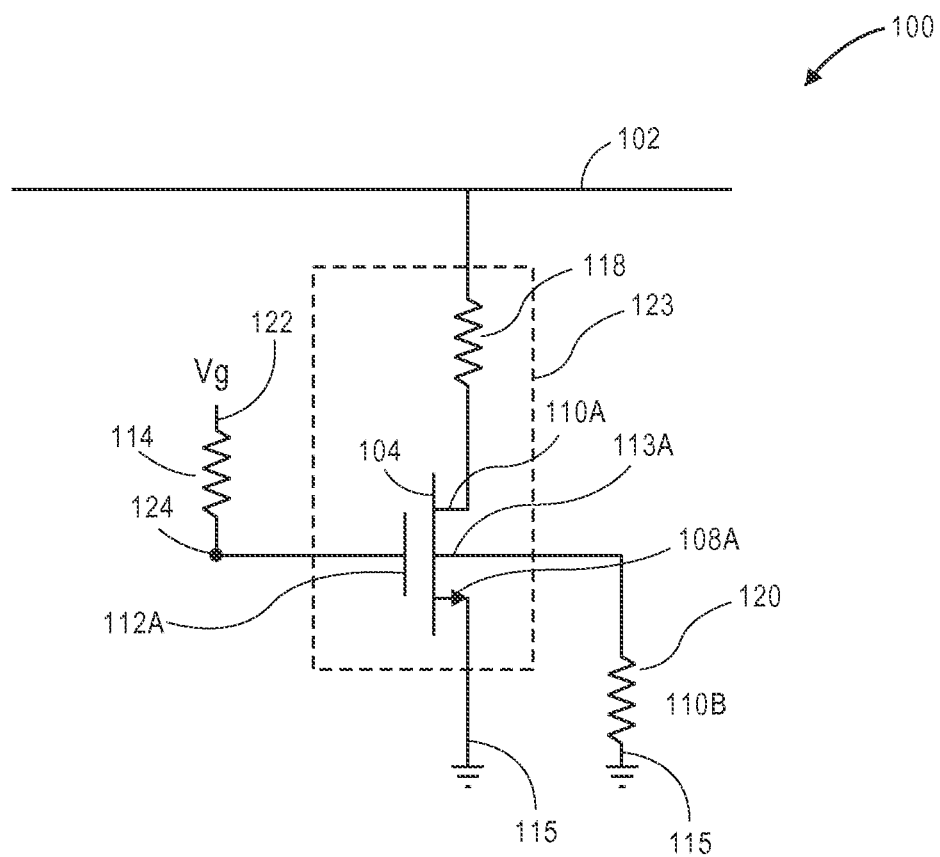
FIG. 1B is a circuit diagram illustrating a voltage controlled variable attenuator in accordance with an example implementation of the present disclosure, wherein the voltage controlled variable attenuator includes a single transistor coupled in series with a resistive component.

FIGS. 1A and 1B illustrate a voltage controlled variable attenuator 100 in accordance with example implementations of the present disclosure. As shown, the variable attenuator 100 is configured to variably attenuate a signal, such as a radio frequency (RF) signal, or to prevent the attenuation of the signal transmitted along a transmission path 102. In implementations, the voltage controlled variable attenuator 100 configured to continuously attenuate the signal transmitted along the transmission path 102. Thus, the attenuator 100 does not attenuate the signal in discrete (e.g., distinct) steps. In an implementation, an alternate current (AC) signal is transmitted along the transmission path 102. The transmission path 102 may be configured in a variety of ways. For example, the transmission path 102 may be, but is not limited to: a metal layer or trace on a printed circuit board, a wire, a cable, and so forth.

As illustrated in FIG. 1A, the voltage controlled variable attenuator 100 illustrated includes a first transistor 104 and a second transistor 106. In one or more implementations, the transistors 104, 106 may be metal-oxide-semiconductor field-effect transistors (MOSFETs). The transistor 104 includes a source 108A, a drain 110A, a gate 112A, and a body terminal 113A, while the transistor 106 includes a source 108B, a drain 110B, a gate 112B, and a body terminal 113B. The body terminals 113A, 113B are utilized to couple the body regions (e.g., substrates) of the respective transistors 104, 106 to a ground terminal 115, which is configured to connect to common ground. The transistors 104, 106 are configured to have an open configuration and a closed configuration. For example, the transistors 104, 106 initially have no conductive channel (e.g., open configuration) that at least substantially prevents current flow between the sources 108A, 108B and the drains 110A, 110B of the respective transistors 104, 106. In an implementation, the resistance of each transistor 104, 106 may be approximately one hundred kilo-ohms (100 k$\Omega$) when the transistors 104, 106 are in the open configuration.

A conductive channel is generated (e.g., closed configuration) in the transistors 104, 106 when a sufficient gate-to-source voltage ($V_{GS}$) is applied between the gates 112A, 112B and the sources 108A, 108B of the respective transistors 104, 106. For example, a conductive channel begins to form when $V_{GS}$ approaches the threshold voltage ($V_T$) of the respective transistors 104, 106. Thus, current can flow between the drains 110A, 110B and the sources 108A, 108B of the respective transistors 104, 106 when there is a voltage difference ($V_{DS}$) between the drains 110A, 110B and the sources 108A, 108B of the respective transistors 104, 106. The resistance of each transistor 104, 106 may vary as a function of the $V_{GS}$ and the width over length ratio (W/L) of the gates 112A, 112B. In an example implementation, when the transistors 104, 106 are in the closed configuration, the resistance of the transistors 104, 106 in series (e.g., combined resistance values of transistors 104, 106) ranges from at least about one hundred and fifty ohms (150$\Omega$) to at least about two hundred and fifty ohms (250$\Omega$). For example, the resistance of the transistors 104, 106 in series is about two hundred ohms (200$\Omega$). In a specific implementation, the W/L ratio of the transistors 104, 106 shown in FIG. 1 may be at least about eight (8). However, the W/L ratio of the transistors 104, 106 may be scaled according to the requirements of the attenuator 100 (e.g., resistance requirements, distortion requirements, etc.), which is described in greater detail below. As shown, the source 108A of the transistor 104 is coupled to the drain 110B of the transistor 106, and the source 108B of the transistor 106 is coupled to the ground terminal 115. It is contemplated that the transistors 104, 106 may be an n-type MOSFET device or a p-type MOSFET device (FIGS. 1A and 1B illustrate n-type MOSFET devices).

The variable attenuator 100 illustrated in FIG. 1A also includes resistive components 114, 116, 118, 120, 122. In implementations, the resistive components are passive resistive components, such as resistors formed within an integrated circuit environment. For example, the resistors may be formed through one or more front-end-of-line (FEOL) processing steps to allow the resistors and the transistors 104, 106 to be packaged within the same die.

The resistive components 114, 116 are utilized to function as a direct current (DC) bias while still providing isolation to the gates 112A, 112B. For example, when an alternating current (AC) signal is present within the transmission path 102, the resistive components 114, 116 may function as open circuits at high frequency (e.g., frequencies greater than or equal to one hundred kilo-hertz (100 kHz)). Thus, the gates 112A, 112B are allowed to float with respect to the AC signal. As shown in FIG. 1, the resistive component 114 is connected between a gate terminal 122 and a node 124. The gate terminal 122 is configured to receive a voltage that is furnished to the gates 112A, 112B. The gate 112A of the transistor 104 is coupled to the resistive component 112 at the node 124, and the resistive component 116 is disposed between the node 124 and the gate 112B of the transistor 106. The resistive components 114, 116, and the configurations of the components 114, 116, are an example implementation. It is contemplated that other types of components may be utilized to function as a DC bias while still providing isolation to the gates 112A, 112B. For example, the resistive components 114, 116 may be at least partially replaced with active circuitry that is configured to provide a DC bias and provide isolation to the gates 112A, 112B. It is also contemplated that other resistive component configurations may be utilized as well (e.g., resistors in parallel to provide the same or similar resistance values as resistive components 114, 116, and so forth).

The resistive components 120, 122 may also furnish a DC bias to the body (bulk) region of the transistors 104, 106, and provide isolation to the body regions from the AC ground potential. As shown, the resistive components 120, 122 are connected between the body terminals 113A, 113B and the ground terminal 115. The resistive component 120 may be disposed between the body terminal 113A of the transistor 104 and a node 126, and the resistive component 122 is disposed between the node 126 and the ground terminal 115. As shown in FIG. 1A, the body terminal 113B is coupled to the node 126. Thus, the body terminals 113A, 113B are coupled to the ground terminal 115 by way of the resistive components 120, 122. As with the resistive components 114, 116, the resistive components 120, 122 allow the body regions to float with respect to the AC signal. It is contemplated that the resistive components 114, 116, 120, 122 may have varying resistance values according to the requirements of the variable attenuator 100. In an example implementation, the resistive component 114 may have a resistance value of approximately one hundred kilo-ohms (100 k$\Omega$), and the resistive components 116, 120, 122 may have a resistance value of approximately fifty kilo-ohms (50 k$\Omega$). However, it is contemplated that the resistive components 116, 120, 122 may have other resistance values as needed to provide isolation and DC bias functionality as described above. Additionally, it is contemplated that other types of components may be utilized to function as a DC bias to the body region of the transistors 104, 106 while still providing isolation to the body regions from the AC ground potential. For example, the resistive components 120, 122 may be at least partially replaced with active circuitry that is configured to provide a DC bias and provide isolation to the body regions of the transistors 104, 106. It is also contemplated that other resistive component configurations may be utilized as well (e.g., resistors in parallel to provide the same or similar resistance values as resistive components 120, 122, and so forth).

In the implementation shown in FIG. 1A, the resistive component 118 is connected between the transmission path 102 and the drain 110A of the transistor 104. The series combination of resistive component 118 and transistors 104, 106 form a variable resistive component 123. The resistive component 118 serves to dominate the overall resistance value of the variable resistive component 123 (e.g., the series resistance value of resistive component 118 and transistors 104, 106 is at least substantially provided by the resistive component 118) to at least partially mitigate the non-linearity effects of the transistors 104, 106. The non-linear regions (e.g., effects) of operation typically occur when the transistors 104, 106 are transitioning from the sub-threshold region of operation to the triode region of operation (e.g., $V_{GS}$ approximately equals, or is near, $V_{TH}$). Thus, the resistive component 118 lowers the voltage across the transistors 104, 106 to limit distortion of the RF signal due to the non-linear transistor resistance. In example implementations, the resistive component 118 may have a resistance value ranging from about seven hundred ohms (700Ω) to about nine hundred ohms (900Ω). In a specific example, the resistance value of the resistive component 118 is about eight hundred ohms (800Ω). Thus, the resistive component 118 may contribute at least approximately seventy percent (70%) to at least approximately ninety percent (90%) of the overall (combined) resistance value of the variable resistive component 123. In the specific example implementations described above (e.g., combined transistor 104, 106 resistance values of two hundred ohms (200Ω) and resistive component 118 resistance value of eight hundred (800Ω)), the resistive component 118 may contribute approximately eighty percent (80%) of the overall resistance value of the variable resistive component 123. However, it is contemplated that the resistance values provided by the transistors 104, 106 and the resistive component 118 and resistive components 116, 120, 122 may vary as needed and various width over length ratios for the transistors 104, 106 may be utilized according to the requirements of the variable attenuator 100.

In FIG. 1B, the voltage controlled variable attenuator 100 illustrated includes a single transistor 104. In this implementation, the variable resistive component 123 includes the resistive component 118 in series with the transistor 104. As shown, the resistive component 118 is coupled between the transmission path 102 and the drain 110A of the transistor 104. The resistive component 118 serves to dominate the overall resistance value of the variable resistive component 123 (e.g., the series resistance value of the resistive component 118 and the transistor 104) to at least partially mitigate the non-linearity effects of the transistor 104 (e.g., when the transistor 104 is transitioning from the sub-threshold region of operation to the triode region of operation). The attenuator 100 also includes resistive components 114, 120. The resistive component 114, which is coupled between the gate terminal 122 and the gate 112A, is utilized to function as DC bias while providing isolation to the gate 112A. The resistive component 120, which is connected between the body terminal 113A of the transistor 104 and the ground terminal 115, is configured to furnish a DC bias to the body region of the transistor 104 and to provide isolation to the body regions from the AC ground potential. It is contemplated that the resistive components 114, 120 may be at least partially replaced with active circuitry to provide the same or similar functionality as described above. It is also contemplated that other resistive component configurations may be utilized as well (resistors in parallel to provide the same or similar resistance values as resistive components 114, 120, and so forth).

As described above, the voltage controlled variable attenuator 100 functions as a voltage variable resistive component that at least substantially prevents insertion loss of an AC signal across the transmission path when the attenuator 100 is in an open configuration (e.g., attenuator functions as an open circuit so that at least substantially no current is allowed to flow within the transistors 104, 106). The attenuator 100 is configured to attenuate the signal across the transmission path 102 when the attenuator 100 is in a closed configuration (e.g., the $V_{GS}$ of each transistor 104, 106 is greater than the respective transistor's $V_{TH}$ to generate a conductive region within each transistor and allow the flow of current within the transistors 104, 106). Thus, the resistive component 123 is configured to absorb the RF signal present within the transmission path 102, which attenuates the RF signal. However, the resistive component 118 limits the overall potential resistance of the resistive component 123, which limits the attenuation range of the resistive component 123. While FIG. 1A illustrates the resistive component 123 including only two (2) transistors in series, it is contemplated that the resistive component 123 may include additional transistors in series with the transistors 104, 106. Thus, for example, the variable attenuator 100 may include an additional transistor in series with the transistors 104, 106 to increase the overall resistance of the resistive component 123 when the transistors are in the closed configuration.

Example Variable Attenuator System

Figure 2:
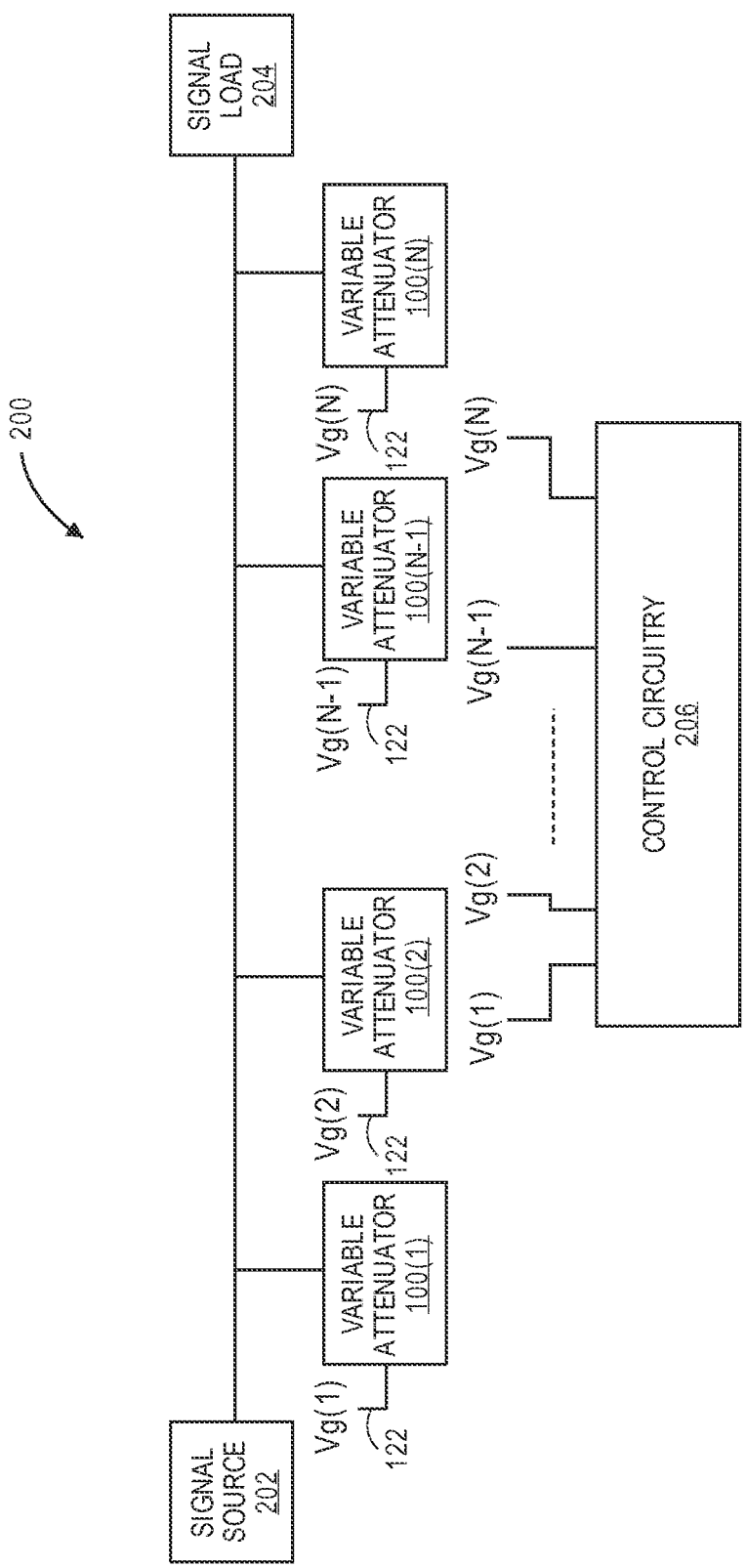
FIG. 2 is a schematic diagram illustrating an example implementation of a system incorporating multiple voltage controlled variable attenuators shown in FIG. 1, where the voltage controlled variable attenuators are coupled in parallel along a transmission path.

FIG. 2 illustrates a system 200 configured to variably attenuate signals in accordance with an example implementation of the present disclosure. The system 200 may, for instance, be employed in an amplifier that is configured to amplify a signal, such as the RF signal. For example, the amplifier may comprise circuitry configured to increase the power of the signal by utilizing an external power source, such as a battery, and so forth. As described above, the resistive component 118 limits the attenuation range of the resistive component 123. As shown in FIG. 2, multiple voltage controlled variable attenuators 100 are connected in parallel to the transmission path 102 to overcome the limited attenuation range of the single voltage controlled variable attenuators 100. The transmission path 102 is configured to carry RF signals between a signal source 202 (e.g., RF source) and a signal load 204 (e.g., RF load). The signal source 202 is configured to generate the RF signal (e.g., RF current), and the signal load 204 is configured to receive the RF signal generated by the signal source 202. In an implementation, the impedance (e.g., internal resistance) of the signal source and the signal load may be about fifty ohms (50Ω).

The system 200 is configured to at least substantially eliminate insertion loss at minimum attenuation when every variable attenuator is in the open configuration. For example, there may be at least approximately zero decibels (0 dB) of insertion loss when the variable attenuators 100 function as an open circuit. Thus, the RF signal present along the transmission path 102 experiences little or no degradation, which reduces signal noise when the RF signal is furnished to the amplifier circuitry portion.

As shown in FIG. 2, the system 200 includes multiple variable attenuators 100 (e.g., variable attenuators 100(1) through 100(N)) to provide the desired insertion loss when one or more variable attenuators 100 are active (e.g., the respective variable attenuator's 100 transistors 104, 106 are in the closed configuration). In an implementation, each first variable attenuator 100(1) may furnish about a tenth of a decibel (1/10 dB) insertion loss. Therefore, the system 200 may include multiple attenuators 100(1) to 100(N), in parallel, to furnish additional gain control (e.g., additional desired insertion loss) to the system 200. For example, the next attenuator 100(2) may furnish an additional amount of insertion loss, and so forth. In this implementation, the length of the gates 112A, 112B associated with the attenuators 100 may range from approximately one and eight tenths micrometers (1.8 μm) to approximately six tenths of a micrometer (0.6 μm). For example, the gate length of the gates 112A, 112B associated with the first attenuator 100(1) may be approximately one and eight tenths micrometers (1.8 µm), and the gate length of gates 112A, 112B associated with the last attenuator 100(N) may be approximately six tenths of a micrometer (0.6 µm). The gate lengths of the gates 112A, 112B associated with the intermediate attenuators 100(2) to 100(N−1) may be within the above described range based upon the design requirements of the system 200 (e.g., distortion requirements, insertion loss requirements, etc.). In implementations, the system 200 is configured to continuously attenuate the signals transmitted along the transmission path 102.

As shown in FIG. 2, the system 200 also includes control circuitry 206 that is configured to supply sufficient voltages (e.g., voltage that transitions, or activates, the transistors 104, 106 of the respective attenuator from an open configuration to a closed configuration) to the variable attenuators 100(1) to 100(N). In an implementation, the control circuitry 206 is configured to supply a sufficient voltage to one or more variable attenuators 100 in a predetermined manner and sequence. For example, the control circuitry 206 may initially supply a sufficient voltage (Vg (1)) to activate the first attenuator 100(1). In this example, the sufficient voltage to activate the transistors 104, 106 of the attenuator 100(1) may be about five volts (5V). Once the voltage (Vg (1)) supplied to the first attenuator 100(1) has reached approximately seventy percent (70%) of the sufficient voltage value (e.g., 3.5 V from the example above), the control circuitry 206 is configured to initiate supply of a sufficient voltage (Vg (2)) to activate the second attenuator 100(2), and so forth. Thus, the voltage may be supplied to each variable attenuator 100(1) to 100(N) in a sequential manner. This may allow for any subsequent non-linear currents within an attenuator to be shunted by the previous attenuators linear current (e.g., previous attenuator's 100(N−1) transistors 104, 106 are within the linear region of operation when the current attenuator's 100(N) transistors 104, 106 are within the non-linear region of operation). In another implementation, the attenuator's 100 may be scaled by the cube root of two ($2^{1/3}$) in sequence, which may allow the attenuator's 100 resistance value to drop by two (2) every third ($3^{rd}$) attenuator 100. For example, the W/L ratio of the transistors 104, 106 of the attenuators 100 may be scaled by the cube root of two ($2^{1/3}$) in sequence. However, these scaling requirements are meant for example purposes only, and the scaling requirements may differ according to the design requirements of the system 200 (e.g., distortion requirements, resistance requirements, decibel requirements and so forth).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A system comprising:
   a transmission path;
   a plurality of variable attenuators coupled to the transmission path in parallel, each variable attenuator comprising:
      at least one transistor having an open configuration for at least substantially preventing the flow of current through the at least one transistor and a closed configuration for at least partially allowing the flow of current through the at least one transistor; and
      a resistive component coupled to the at least one transistor and configured to couple with the transmission path, the resistive component configured to at least partially mitigate non-linear effects when the at least one transistor transitions from the open configuration to the closed configuration,
   the at least one transistor and the resistive component configured to at least partially attenuate a signal transmitted along the transmission path when the at least one transistor is in the closed configuration,
   wherein at least one variable attenuator of the plurality of variable attenuators are configured to facilitate at least partially attenuating the signal without utilizing a pi-impedance network, wherein the at least one transistor of respective variable attenuators of the plurality of variable attenuators are scaled by cube root of two in sequence.

2. The system as recited in claim 1, wherein the at least one transistor comprises a metal-oxide-semiconductor field-effect transistor (MOSFETs).

3. The system as recited in claim 2, wherein the at least one transistor further comprises an n-type MOSFETs.

4. The system as recited in claim 1, wherein the at least one transistor includes a gate configured to receive a voltage, and wherein a width over length (W/L) ratio of the gate is at least eight (8).

5. The system as recited in claim 1, wherein the signal comprises a radio frequency (RF) signal.

6. The system as recited in claim 1, wherein resistive component comprises a resistor.

7. The system as recited in claim 1, wherein the at least one transistor and the resistive component are configured to furnish a combined resistance value, and wherein the resistance value of the resistive component ranges from at least seventy percent (70%) to at least ninety percent (90%) of the combined resistance value of the at least one transistor and the resistive component when the at least one transistor is in the closed configuration.

8. A system comprising:
   a transmission path;
   a plurality of variable attenuators coupled to the transmission path in parallel, each variable attenuator comprising:
      a first transistor;
      a second transistor connected in series with the first transistor, the first transistor and the second transistor having an open configuration for at least substantially preventing the flow of current through the first transistor and the second transistor and a closed configuration for at least partially allowing the flow of current through the first transistor and the second transistor; and
      a resistive component disposed between the transmission path and the first transistor, the resistive component configured to at least partially mitigate non-linear effect when the first transistor and the second transistor transition from the open configuration to the closed configuration,
   the first transistor, the second transistor, and the resistive component configured to at least partially attenuate a signal transmitted along the transmission path when the first transistor and the second transistor are in the closed configuration,
   wherein the system is configured to facilitate at least partially attenuating the signal without utilizing a pi-impedance network, wherein the at least one of the first transistor or the second transistor of respective variable attenuators of the plurality of variable attenuators are scaled by cube root of two in sequence.

9. The system as recited in claim 8, further comprising a control circuitry configured to supply a voltage to the plurality of variable attenuators in a predetermined sequence.

10. The system as recited in claim 8, wherein the first transistor and the second transistor comprise may be metal-oxide-semiconductor field-effect transistors (MOSFETs).

11. The system as recited in claim 10, wherein the first transistor and the second transistor further comprise n-type MOSFETs.

12. The system as recited in claim 8, wherein the first transistor and the second transistor each include a gate configured to receive a voltage, wherein a width over length (W/L) ratio of at least one of the gates of the first transistor or the second transistor is at least eight (8).

* * * * *